United States Patent [19]

Suzuki et al.

[11] Patent Number: 4,641,248

[45] Date of Patent: Feb. 3, 1987

[54] METHOD FOR DETERMINING RELIABILITY IN ELECTRIC POWER SYSTEM

[75] Inventors: Mamoru Suzuki, Tokyo; Shinta Fukui, Hyogo, both of Japan

[73] Assignees: The Tokyo Electric Power Co., Inc.; Mitsubishi Denki Kabushiki Kaisha, both of Tokyo, Japan

[21] Appl. No.: 552,351

[22] Filed: Nov. 16, 1983

[30] Foreign Application Priority Data

Nov. 17, 1982 [JP] Japan ................................. 57-201514

[51] Int. Cl.$^4$ ............................................. G05B 9/02
[52] U.S. Cl. .................................... 364/492; 364/184; 364/550
[58] Field of Search ......................... 364/184, 492, 550

[56] References Cited

U.S. PATENT DOCUMENTS 3,863,270  1/1975  Haley et al. .................... 364/492 X

*Primary Examiner*—Gary Chin
*Assistant Examiner*—Edward R. Cosimano
*Attorney, Agent, or Firm*—Bernard, Rothwell & Brown

[57] ABSTRACT

In a method of determining reliability in an electric power system, various data including data representing generated energy and load amount and connecting status of the power system, is inputted, and a series of cyclic processes including a calculation regarding Jacobian are executed for the reliability decision. If variation of the generated energy and load is less than a predetermined value and the connecting status is not varied, the calculation process regarding the Jacobian is not executed but the previous processing result is used, while if the connecting status is varied, the previous processing result is partially corrected.

4 Claims, 2 Drawing Figures

METHOD FOR DETERMINING RELIABILITY IN ELECTRIC POWER SYSTEM

BACKGROUND OF THE INVENTION

1. Field of the Invention

This invention relates to an on-line method for determining the reliability of an electric power system. It relates more specifically to a method in which data from the power system, including data representing generated energy and load amount, and system connecting status, are inputted, for calculating voltage, frequency and power flow of the power system, and for determining reliability of the power system to indicate faults or to control system operation.

2. Description of the Prior Art

In order to determine reliability of a power system, the power flow must be calculated. However, the calculation includes many complicated operational processes, such as a process for generating and executing an LU decomposition of the Jacobian so that the load of a computer becomes very large. In the prior art, therefore, even if data of the power system are provided via on-line operation, the required processes to the data cannot be carried out at a fast enough speed to suitably execute processes regarding fault indication and system operation.

FIG. 1 shows a flow chart of an algorithm for power flow calculation in the prior art. First, data, including data representing generated power and load amount and system connecting status, are inputted from the power system (process 1). Using the inputted data, a preparatory process for power flow calculation, for example, a process for generating admittance matrix or process for converting data into which is adapted for the flow calculation, is carried out (process 2). A Jacobian is then generated (process 3) and a process is initiated to provide LU decomposition of the Jacobian (processs 4) to obtain data required for convergence calculation of the flow. Calculations of the power flow and its convergence calculation are performed in process 5. Using the result of the convergence calculation, a post process (process 6), for example, a process for obtaining the output value of bus line voltage or power flow in lines of the system, is carried out. Finally, reliability of the power system is determined (process 7) using the bus line voltage and power flow calculated in process 6 to complete one cycle and the further process returns to step 1.

According to such a process cycle, formation and LU decomposition of the Jacobian requiring much processing time must be executed in every cycle so that it is difficult to indicate a fault or to control system operation at any time, and to use present data from the power system to execute the real-time process in a limited time. The lower the processing speed becomes, the lower the decision accuracy becomes.

SUMMARY OF THE INVENTION

It is an object of the invention to provide a method for determining reliability in a power system wherein the amount of processing required for the reliability decision is reduced to adapt the processing to on-line operation.

It is another object of the invention to provide a method for determining reliability in a power system wherein the process is performed at high speed with increased accuracy of the decision result.

An on-line method of cyclically determining reliability in a power system includes a process for inputting various data representing generated energy, load amount, and connecting status of the system; calculation processes for calculating a Jacobian and power flow convergence; and a process for determining reliability of the power system from the results of executed processes. However, if a variation of the generated energy and load amount is less than a predetermined value and the connecting status is not changed from a previous cycle, the process regarding the Jacobian is not executed again but the previous Jacobian processing result is reused; and if variation of the generated power and load amount is less than the predetermined value but only the connecting status is changed, the result of Jacobian process is partly corrected.

DESCRIPTION OF THE PREFERRED EMBODIMENT

Figure 1:
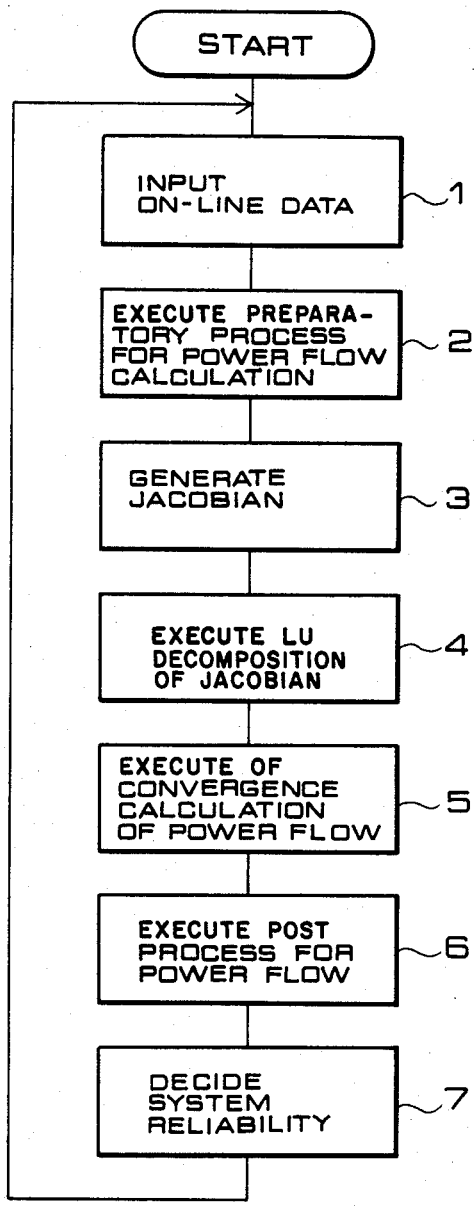
FIG. 1 is a flow chart showing an algorithm for a reliability decision method of a power system in prior art.
Figure 2:
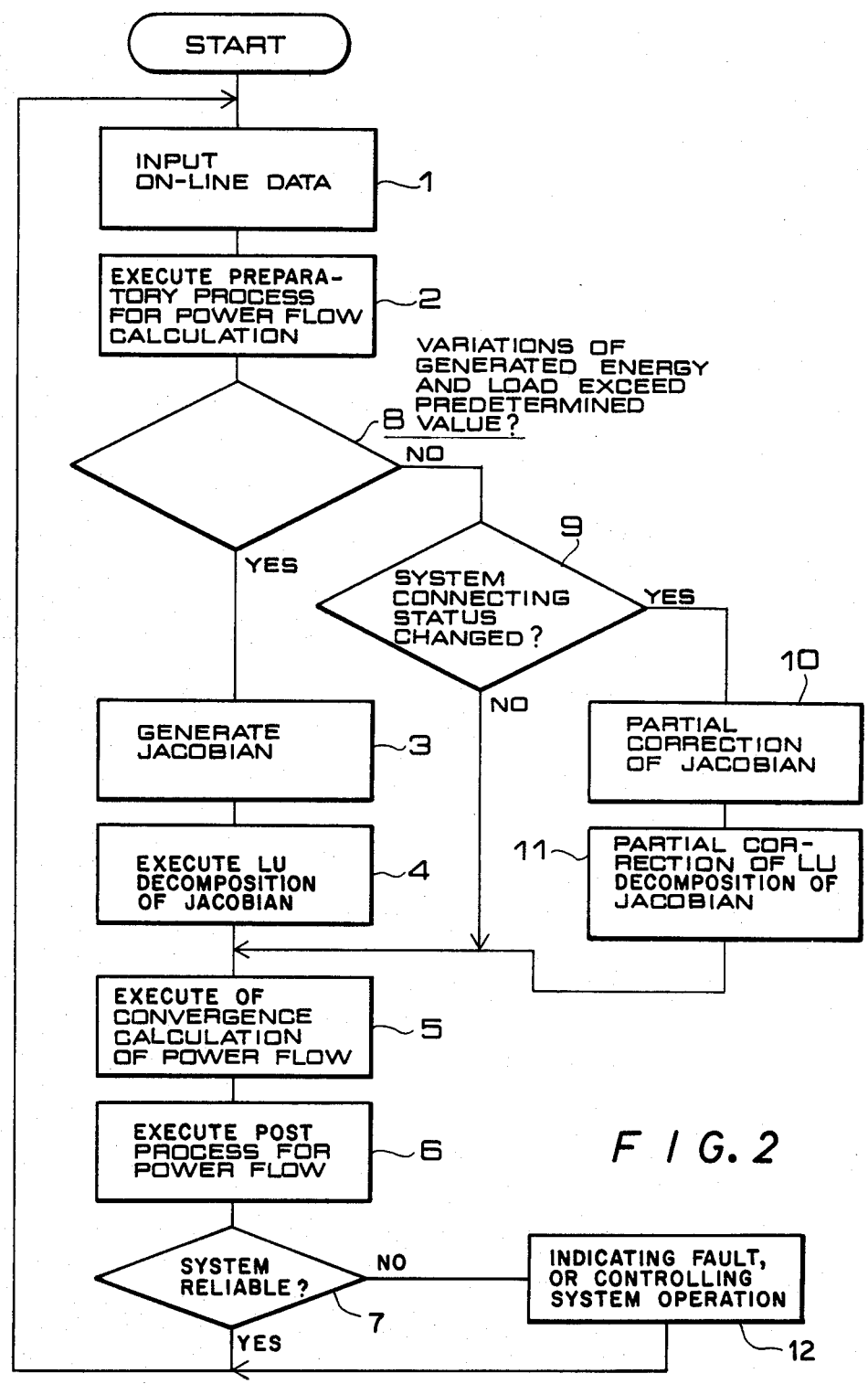
FIG. 2 is a flow chart showing an algorithm for a reliability decision method of a power system according to an embodiment of the invention.

FIG. 2 shows a flow chart of an algorithm for determining reliability in a power system according to an embodiment of the invention, wherein the same reference numerals as those shown in FIG. 1 designate similar steps. Data is read from the power system in process step 1 and preparatory process to the data is performed in process 2, as described above. Using a result of the preceding process, 2 decisions are made whether variations of generated energy and load amount are within predetermined limits (decision 8). If either decision is affirmative, process 3-7 as already described with reference to FIG. 1 are executed. That is, the generation of the Jacobian (process 3), the LU decomposition therefor (process 4), the convergence calculation of the power flow (process 5), the post processing therefor (process 6), and the decision of the reliability of the power system (decision 7) are performed.

If both decision results in decision 8 are negative, a decision is made whether the connecting status of the system has been changed (decision 9). That is, the system status in the preceding process cycle is compared with that of present process cycle. If any change in system connecting status exists between these cycles, process 10 is performed; if not, process 5 is performed. Thus, when decision 8 is negative, the process 3 for generating Jacobian and the process 4 for executing LU decomposition therefore are omitted. If decision 9 is affirmative, partial correction of the Jacobian is executed in process 10, and partial correction of LU decomposition of the Jacobian is executed in process 11. The processing operation then returns to the main routine to perform process 5.

It should be understood that the time required for executing processes 10 and 11 is shorter than that required for processes 3 and 4. It should also be noted that partial correction of the processing results regarding Jacobian does not result in an appreciable error in the final processing result, since variation of generated power and load amount within a single process cycle is negligibly small in an ordinary and practicable system. Moreover, the number of executions of process 3 and 4 is decreased. Instead these processes are not executed or processes 10 and 11 having less time than that of processes 3 and 4 are executed. Thereby a power control system adaptable for on-line operation is obtained to enable process 12 to indicate faults or to control system operation when decision 7 is negative.

What is claimed is:

1. A method for determining reliability in an electric power system, comprising the cyclically performed steps of:
   inputting various data including data representing generated energy and load amount and connecting status of the power system;
   executing a first calculation process with respect to a Jacobian;
   executing a second calculation process for converging calculation of power flow;
   executing a reliability decision process for determining the reliability of the power system from the result of said first and second calculation processes;
   executing a first variation decision process for determining whether any variation shown in the data of the generated energy and load is less than a predetermined value and carrying out said first calculation process if an affirmative result is obtained;
   if a negative result is obtained in said first variation decision process, executing a second variation decision process for determining whether any change in the connecting status for the power system has occurred and carrying out said second calculation process if a negative result regarding the connecting status is obtained in said second decision process;
   if an affirmative result is obtained in said second variation decision process, executing a third calculating process for partially correcting of the calculation result of said first calculation process regarding the Jacobian in a preceding cycle and then carrying out said second calculation process; and
   executing a process for indicating a fault in the power system in response to a negative result in the reliability decision process.

2. A method of determining reliability as set forth in claim 1, wherein said first calculation process with respect to a Jacobian includes a process for generating the Jacobian and a process for executing LU decomposition of the Jacobian.

3. A method for controlling an electric power system comprising the cyclically performed steps of:
   inputting various data including data representing generated energy and load amount and connecting status of the power system;
   executing a first calculation process with respect to a Jacobian;
   executing a second calculation proces for converging calculation of power flow;
   executing a reliability decision process for determining the reliability of the power system from the result of said first and second calculation processes;
   executing a first variation decision process for determining whether any variation shown in the data of the generated energy and load is less than a predetermined value and carrying out said first calculation process if an affirmative result is obtained;
   if a negative result is obtained in said first variation decision process, executing a second variation decision process for determining whether any change in the connecting status of the power system has occurred and carrying out said second calculation process if a negative result regarding the connecting status is obtained in said second decision process;
   if an affirmative result is obtained in said second variation decision process, executing a third calculating process for partially correcting of the calculation result of said first calculation process regarding the Jacobian in a preceding cycle and then carrying out said second calculation process; and
   executing a process for controlling the power system in response to a negative result in the reliability decision process.

4. A method of determining reliability as set forth in claim 3, wherein said first calculation process with respect to a Jacobian includes a process for generating the Jacobian and a process for executing LU decomposition of the Jacobian.

* * * * *